United States Patent [19]

Kubokoya et al.

[11] Patent Number: 4,989,064
[45] Date of Patent: Jan. 29, 1991

[54] ALUMINUM ALLOY LINE RESISTIVE TO STRESS MIGRATION FORMED IN SEMICONDUCTOR INTEGRATED CIRCUIT

[75] Inventors: Ryoichi Kubokoya, Anjo; Yasushi Higuchi, Kariya; Kazunori Kawamoto, Anjo, all of Japan

[73] Assignee: Nippondenso Co., Ltd., Japan

[21] Appl. No.: 376,144

[22] Filed: Jul. 5, 1989

Related U.S. Application Data

[63] Continuation of Ser. No. 100,277, Sep. 23, 1987, abandoned.

[30] Foreign Application Priority Data

Dec. 17, 1986 [JP] Japan ................................ 61-300725

[51] Int. Cl.$^5$ .................... H01L 23/48; H01L 29/46; H01L 29/62; H01L 29/64
[52] U.S. Cl. ........................................ 357/67; 357/71; 357/52; 357/54; 148/11.5 A; 437/197
[58] Field of Search ........................... 357/71; 437/197

[56] References Cited

U.S. PATENT DOCUMENTS

| | | | |
|---|---|---|---|
| 4,017,890 | 4/1977 | Howard et al. | 357/67 |
| 4,219,369 | 8/1980 | Ogiue et al. | 357/54 |
| 4,438,450 | 3/1984 | Sheng et al. | 357/67 |
| 4,532,695 | 8/1985 | Schuermeyer | 357/67 |
| 4,556,897 | 12/1985 | Yorikane et al. | 357/67 |
| 4,561,009 | 12/1985 | Yonezawa et al. | 357/67 |
| 4,566,177 | 1/1986 | van de Ven et al. | 357/67 |
| 4,897,709 | 1/1990 | Yokoyama et al. | 357/68 |
| 4,912,542 | 3/1990 | Suguro et al. | 357/67 |
| 4,949,162 | 8/1990 | Tamaki et al. | 357/54 |

FOREIGN PATENT DOCUMENTS

61-263244 11/1986 Japan .

OTHER PUBLICATIONS

Rosenberg, "Reduced Electromigration Damage in Al-Cu Stripes" IBM Technical Disclosure Bulletin, vol. 13, No. 12, May 1971, pp. 3826–3827.
Curry et al., "New Failure Mechanisms in Sputtered Aluminum-Silicon Films", IEEE 1984, International Reliability Physics, pp. 6–8.
Bell Laboratory; "Dependence of Al Voids Upon Al Thin Film", 1985, J. Electrochem Soc. Solid and Technology, 1984, IEEE/IRPS, pp. 1–16.
Extended Abstracts (The 47th Autumn Meeting, 1986); The Japan Society of Applied Physics, 9/27/1986, (5 pages).
Owada et al., "Stress Induced Slit-Like Void Formation In a Fine-Pattern Al-Si Interconnect During Aging Test", Jun. 25–26, 1985, V-MIC, pp. 173–179.
47-th Academic Lecture of the Applied Physics Association Meeting (Symposium).
Nikkei Microdevices (Dec., 1986), pp. 85–100, "Barrier Metal and Cu-Doped Ae Necessary".
Nikkei Microdevices (Sep., 1985), pp. 50–52, "Proposal of New Mechanism of Ae Burn-Out Defect".

Primary Examiner—Eugene R. LaRoche
Assistant Examiner—Michael B. Shingleton
Attorney, Agent, or Firm—Cushman, Darby & Cushman

[57] ABSTRACT

A first PSG film having a control hole is formed on a silicon substrate formed having a circuit, and a first aluminum alloy line layer resistive to stress migration made of Al-Si alloy is formed on the first PSG film, so as to electrically contact, via the contact hole, the surface of a semiconductor substrate. The alloy line layer is formed by use of a sputtering method, and the crystal face is oriented, mainly in the (111) plane, by controlling the substrate temperature at the time of sputtering, as well as the Ar gas pressure, the alloy depositing rate, and the degree of vacuum prior to the commencement of alloy depositing. The grain size l of the alloy crystal is set so as to satisfy "(W/14)<l<W" with respect to the width W of the line formed by etching, and preferably to also satisfy "(W/4)<l<(W/1.5)".

25 Claims, 7 Drawing Sheets

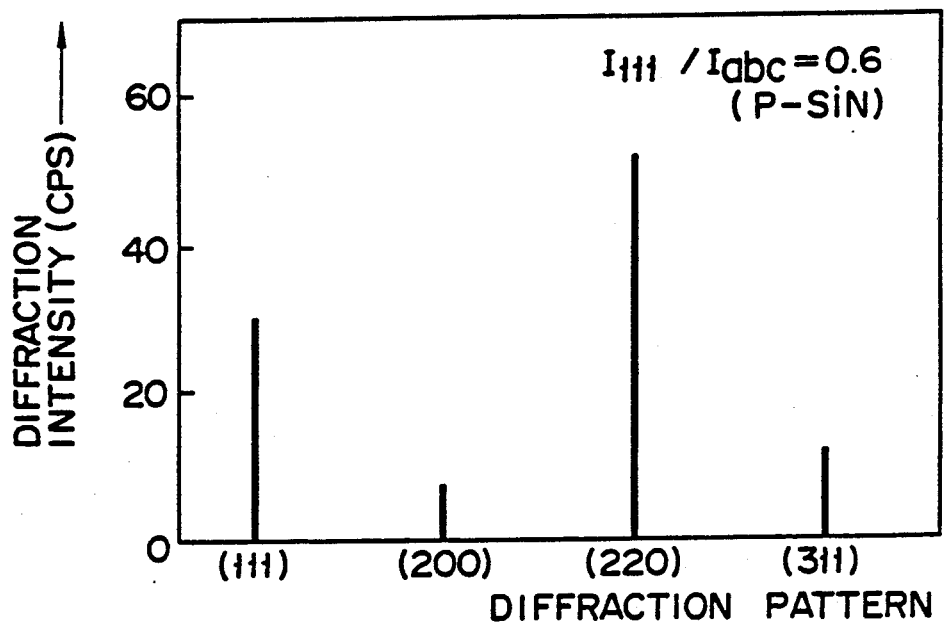
F I G. 7A
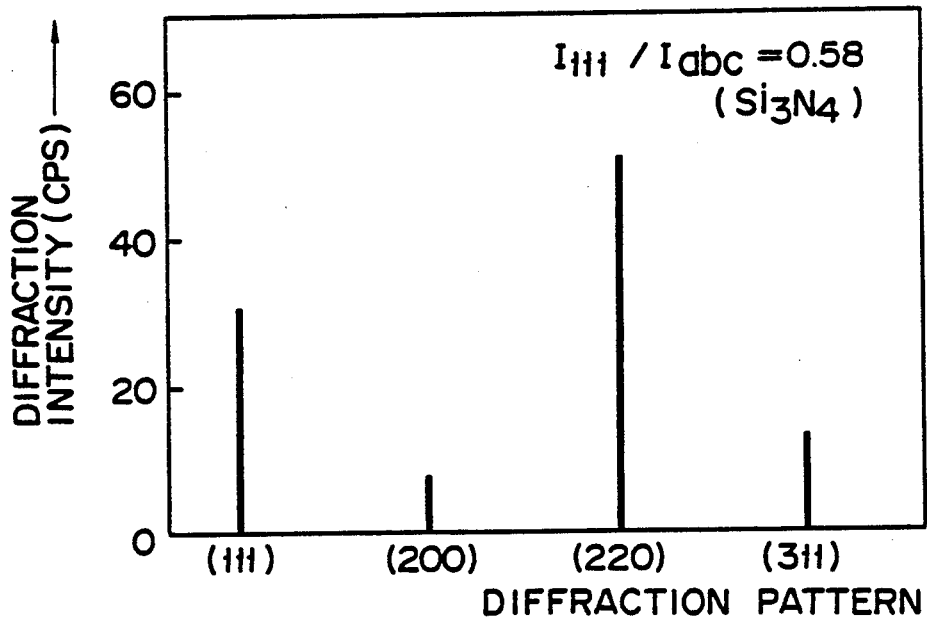
F I G. 7B

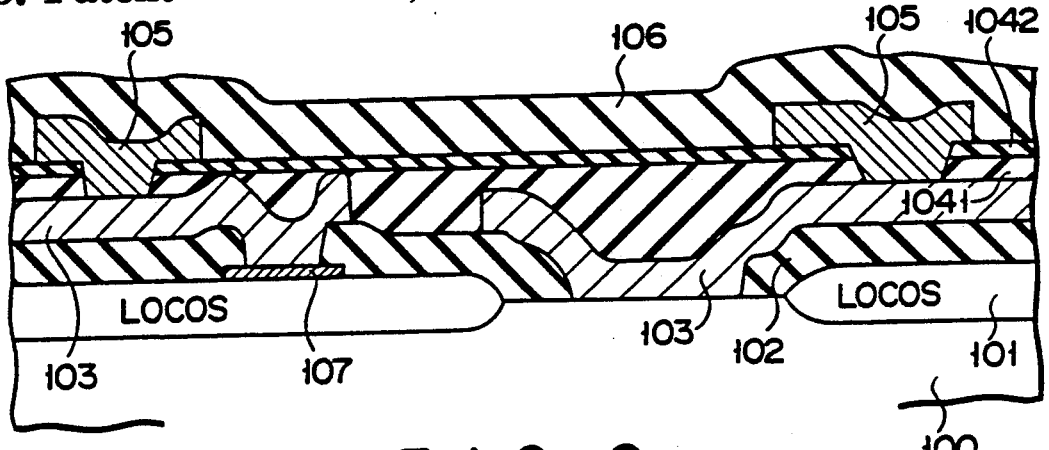
F I G. 9
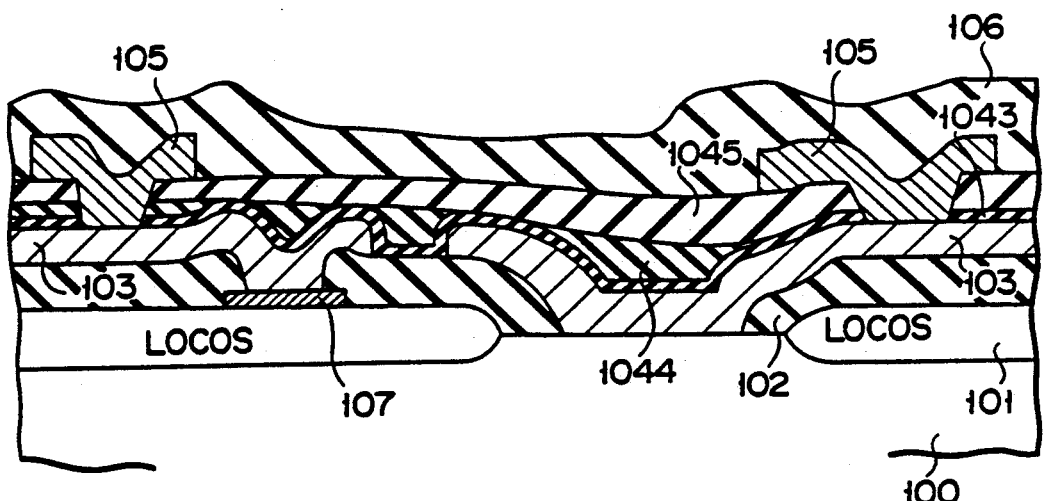
F I G. 10
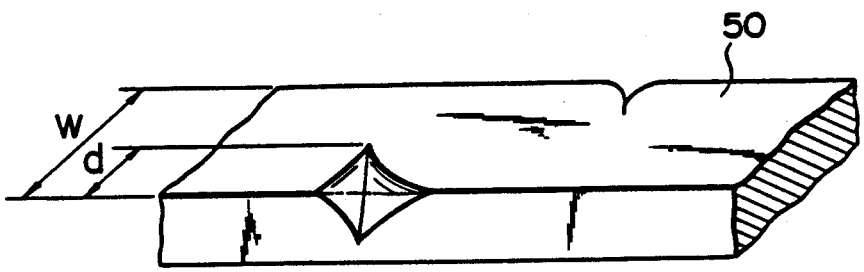
F I G. 11

ALUMINUM ALLOY LINE RESISTIVE TO STRESS MIGRATION FORMED IN SEMICONDUCTOR INTEGRATED CIRCUIT

This is a continuation of application 07/100,277, filed Sept. 23, 1987, which was abandoned upon the filing hereof.

BACKGROUND OF THE INVENTION

The present invention relates to aluminum alloy line formed in an LSI and, more particularly, to an improved aluminum alloy line formed by microminiaturization, having a small number of defects (referred to hereinafter as "Al void").

The achieving of high integration in semiconductor integrated circuits has recently become highly desirable. High integration requires the use of specialized techniques for microminiaturization and multi-metal-layer lamination in a line structure. Microminiaturization of the line structure necessitates the design of an aluminum alloy line of much narrower width than has previously been attained. When the width of the aluminum alloy line is reduced to as small as 2 to 3 microns or less, Al voids tend to occur in the line.

Since the multi-metal-layer line structure is made of various thin films such as thin insulator films and thin aluminum alloy films, stress is imposed on the internal structure of a semiconductor device including the multi-metal-layer line, which causes Al voids to be produced in the aluminum alloy line. A semiconductor integrated circuit having large Al voids is not reliable. For example, Al voids cause the line to burn out or become disconnected, or cause a reduction of its sectional area, resulting in an increase in the electrical resistance of the layer. An increase in the electrical resistance causes increased heat generation which causes the line to become disconnected and thus, the operating speed of the circuit is reduced. The increase in the electrical resistance of the line may cause electromigration when a large current flows in the line.

By means of a model test, it has been found that Al voids are formed in the following way. When tensile stress is applied from a passivation film to the aluminum alloy line, it is concentratedly applied at the crystal grain boundaries of the line. In order to alleviate this concentrated stress, the aluminum atoms moves from the grain boundaries, inevitably forming Al voids. This phenomenon is known as stress migration. Hence, in order to suppress such movement of aluminum atoms, thereby to avoid Al voids, copper, which can readily precipitate in the grain boundaries an in Al-Si allow line, has been added to the allow, thus providing an Al-Si-Cu alloy line. In the Al-Si-Cu alloy line, the copper acts as an obstacle to the movement of the aluminum atoms, thus suppressing the formations of Al voids.

However, while the Al-Si-Cu alloy line can suppress the forming of Al voids to a certain degree, it cannot, however, reduce the void coefficient ratio lv of the alloy line below 30%–40%.

Here, the void coefficient ratio lv is the value represented by the following equation:

$$lv = d/W$$

where W is the width of aluminum alloy line 50, and d is the maximum void width in FIG. 11. The smaller the void coefficient ratio lv the more the occurrence of voids is suppressed.

SUMMARY OF THE INVENTION

An object of the present invention is to provide aluminum alloy line in a semiconductor integrated circuit, which has a small number of Al voids so that the circuit is reliable.

Another object of the present invention is to provide an aluminum alloy line structure which is capable of readily and reliably integrating a semiconductor integrated circuit without either breaking the line or reducing its cross sectional area, even if the aluminum alloy line is sufficiently microminiaturized.

In the present invention, an aluminum alloy line is formed as an electrical connecting means on a semiconductor substrate, the alloy crystals thereof being oriented in the (111) crystal plane.

Further, the grain size of the aluminum alloy is controlled to satisfy the following condition:

$$(W/14) < l < W$$

where l is the grain size and W is the width of the aluminum alloy line.

Since Al atoms are closely packed in the (111) plane when the crystal face of the aluminum alloy line is oriented mainly in the (111) plane, the Al atoms suppress each other's movement. In other words, since the movement of the Al atoms for alleviating the internal stress of the aluminum alloy line is suppressed, the occurrence of Al voids is suppressed.

In this case, when the grain size of the aluminum alloy is set to 1/14 to 1 times the width of the aluminum alloy line, the movement of Al atoms is further suppressed. Thus, the occurrence of Al voids can be suppressed yet more effectively by satisfying this condition, thereby improving the reliability of the semiconductor integrated circuit.

BRIEF DESCRIPTION OF THE DRAWINGS

FIGS. 7A, 7B, 8A, and 8B are views showing the state of the diffraction intensities in the orientation of the alloy line, each, being measured when aluminum alloy lines are formed on a different layer;

FIGS. 9 and 10 are sectional views showing the construction of a semiconductor device according to second and third embodiments of the present invention; and FIG. 11 is a view for describing the void coefficient ratio lv.

DETAILED DESCRIPTION OF THE PREFERRED EMBODIMENTS

Figure 1:
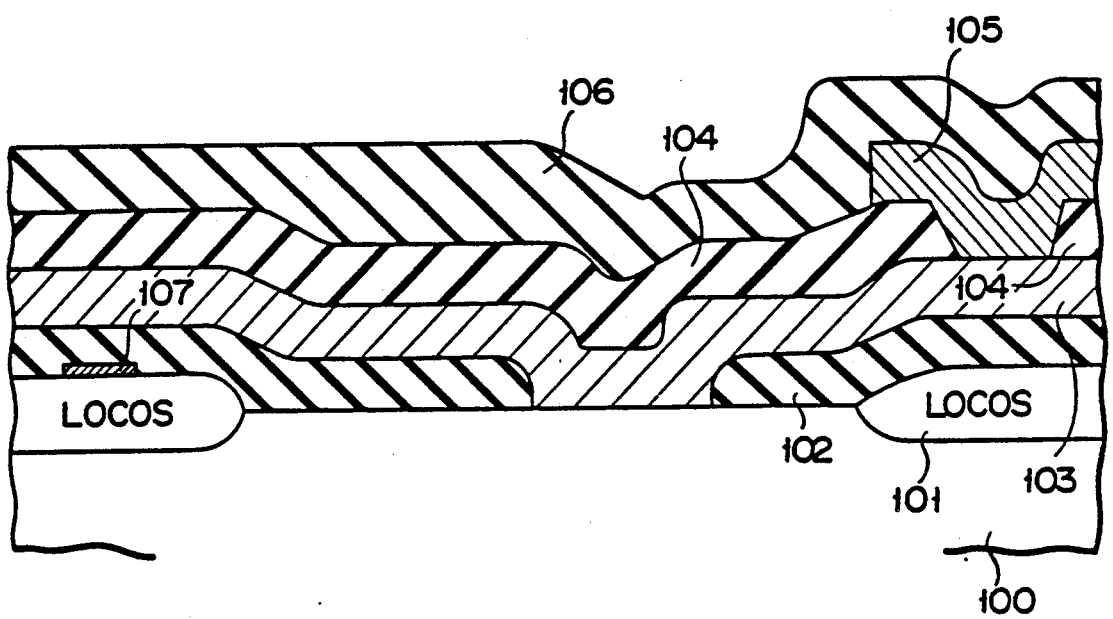
FIG. 1 is a sectional view showing the construction of a semiconductor device with an aluminum alloy line according to a first embodiment of the present invention.

FIG. 1 shows the sectional structure of a semiconductor device with an aluminum alloy line. Silicon nitride film ($Si_3N_4$) is formed on silicon substrate 100, and LOCOS 101 is formed as a field oxide film by means of thermal oxidation, with the silicon nitride film being used as a mask.

When LOCOS 101 is formed thus, the silicon nitride film used as the mask is removed, and a semiconductor device is then formed. Then, first PSG (phosphorus glass) film 102, which is used as an insulating film, is formed by use of a deposition method such as CVD (Chemical Vapor Deposition) method. An opening in the PSG film 102, is formed to expose a surface portion of the substrate 100. First Al-Si alloy line layer 103 is formed by use of, for example, a sputtering method on PSG film 102. In other words, line layer 103 is electrically connected to the exposed surface portion of substrate 100 via the opening formed in PSG film 102.

Means for forming first alloy line layer 103 will now be described in more detail.

First Al-Si alloy line layer 103 is formed on first PSG film, 102, by use of a sputtering method. Layer 103 contacts the surface of substrate 100 through the opening in the first PSG film 102. Here, the crystal face of the Al-Si alloy is oriented such that the crystal grains are packed in the (111) plane by controlling the substrate heating temperature, and the type and the quantity of residual gas at the sputtering time. The thin Al-Si alloy film is photoetched to form a line pattern, for example, from 2 microns of line width to 0.7 micron of ⅓ of the width in the grain size of the Al crystal and is then heat treated for a predetermined length of time.

Figure 2A:
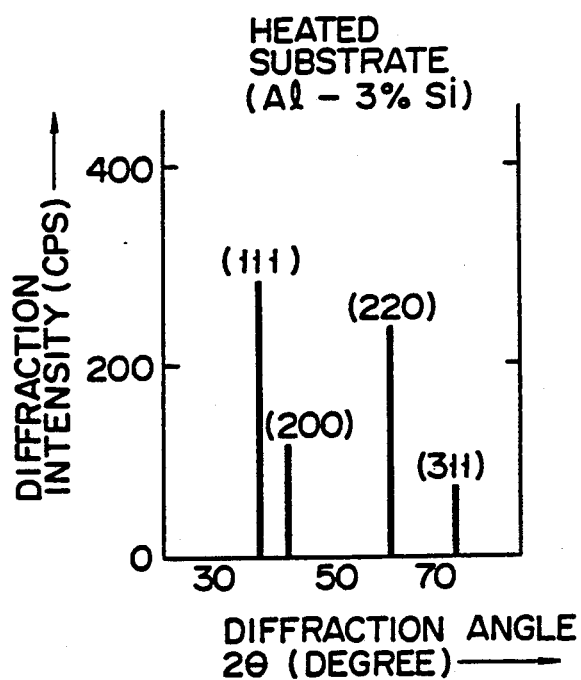
FIGS. 2A to 2C are views showing diffraction intensities corresponding to the orientation of the crystal face of aluminum alloy, each diffraction intensity being measured when a different heat treatment is applied to the substrate.
Figure 2B:
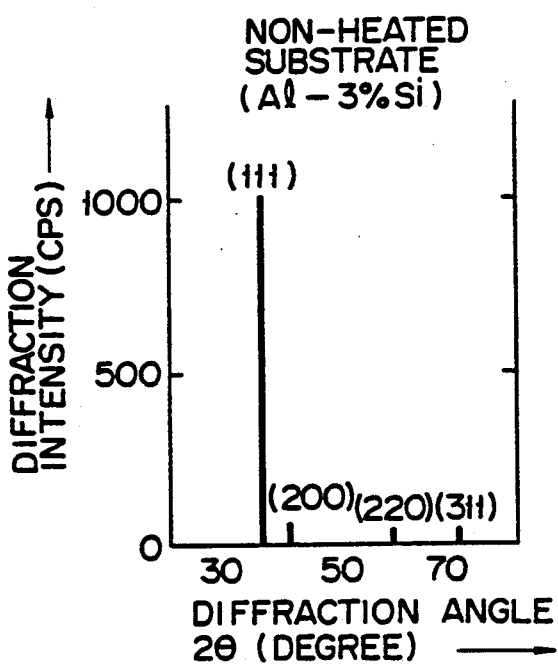

When the heating of substrate 100 is noted as an object to be controlled to orient the crystal face of alloy line layer 103 in the (111) plane, heated substrate 100 has various diffraction angles, as is shown in FIG. 2A, when the substrate is sputtered by heating. When the substrate is not heated, crystal grains are mainly oriented in the (111) plane, as is shown in FIG. 2B. When, however, the substrate is not heated, the step coverage of the aluminum alloy line is insufficient, and the Al crystal becomes too small. Therefore, it is essential that the substrate be heated to a suitable temperature.

The Al-Si alloy layer is formed by use of, for example, a magnetron sputtering method. In this case, the minimum line width is 2 to 3 microns, and the substrate is heated to approx. 150° to 200° C.

When first alloy line layer 103 is formed thus, second PSG film 104 is formed, again by use of a depositing or CVD method, so as to cover line layer 103. Here, a contact opening reaching first alloy line layer 103 is formed by means of etching in second PSG film 104, so as to achieve an electrical connection to first alloy line layer 103.

Second Al-Si alloy line layer 105 is formed on second PSG file 104, in a similar way to the first alloy line layer 103, and line layer 105 is electrically connected, via the contact opening, to line layer 103. In this way, a multimetal-line layer is formed. Subsequently, surface protection film 106 made of a silicon nitride film is formed by means of, for example, a plasma CVD method, to protect the front surface. Line layer 107 made of, for example, polycrystalline silicon, is formed on substrate 100, and is connected to the alloy line layer of the multimetal-layer line structure.

Aluminum line layers 103 and 105 of the semiconductor device formed as described above are formed such that their crystal faces are oriented in the (111) plane, at the time of depositing the Al-Si alloy. Since the Al atoms are packed in the highest density in, the (111) plane, as described above, the movement of the Al atoms during the formation of line layers is suppressed by other Al atoms. Therefore, the movement of the Al atoms to the grain boundaries, for alleviating the internal stress of the aluminum alloy line layer, is suppressed, thereby effectively suppressing the occurrence of Al voids.

The above description will now be explained in conjunction with the inventor's actual experimental results.

Figure 3A:
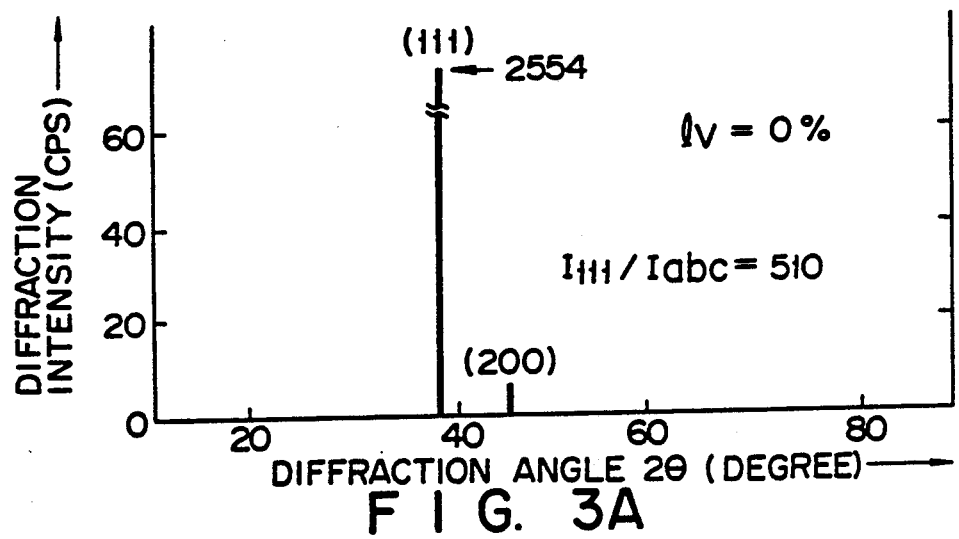
FIGS. 3A to 3C are views showing the relationship between the diffraction intensity and the orientation of the crystal face and void coefficient ratio lv.
Figure 3B:
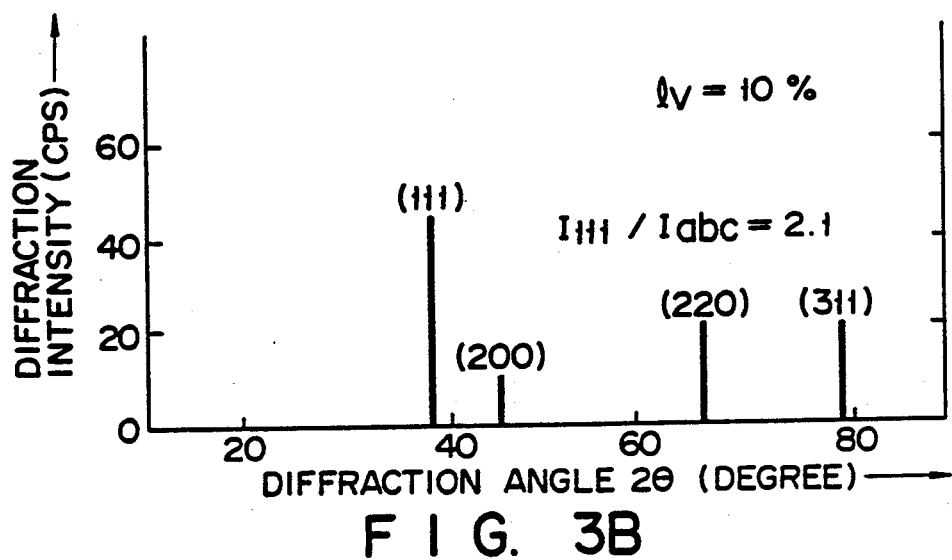
Figure 3C:
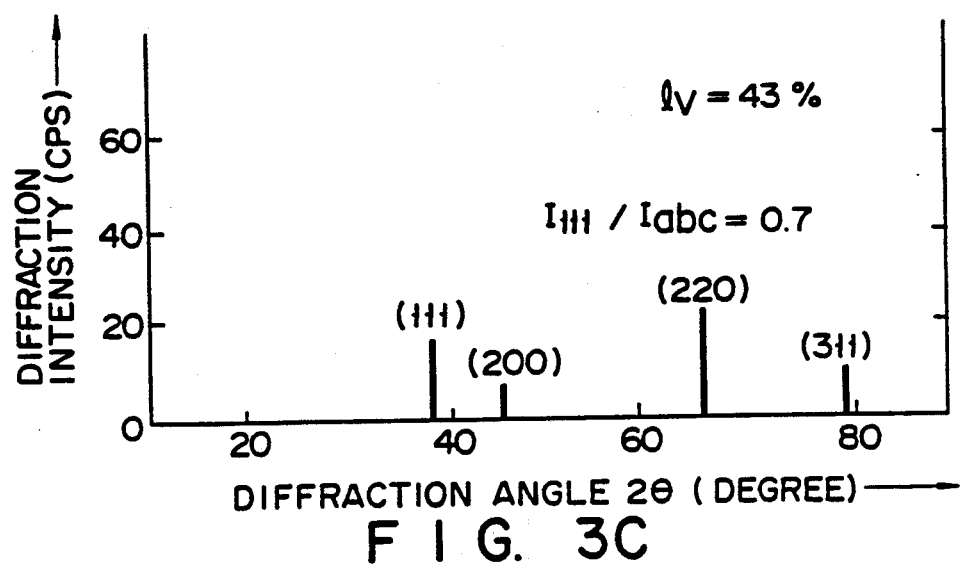

FIGS. 3A to 3C show the diffraction intensities determined by the orientation of the crystal face, where the abscissa axes indicate diffraction angle $2\theta$ and the ordinate axes indicate diffraction intensities, as well as the values of void coefficient ratio lv.

Figure 4:
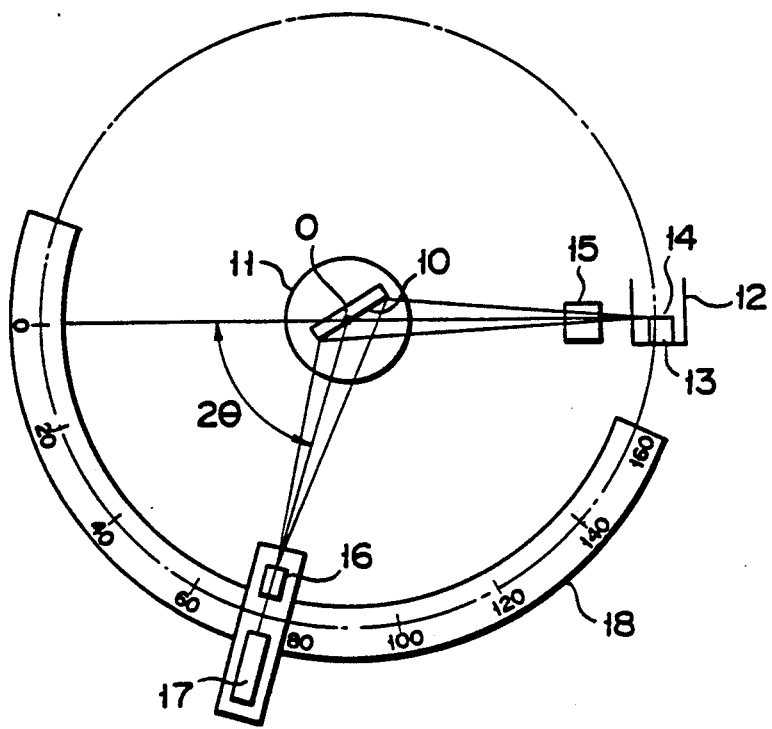
FIG. 4 is a view showing a schematic construction as seen from above, to describe a diffractometer used as means for obtaining the diffraction intensity in FIG. 3.

Here, the magnitude of the diffraction intensity was measured by means of a diffractometer shown, for example, in FIG. 4. The diffractometer was so set that sample 10, on which surface Al-Si alloy was formed was, for example, mounted on base 11, which is rotatable around an axis 0 perpendicular to this paper. X-ray tube 12 was used as an X-ray source, and generated a divergent X-ray from a linear focus 14 onto target 13. The divergent X-rays was irradiated through slit 15 to the surface of sample 10, to be diffracted, the diffracted X-ray were focused in slit portion 16, and were counted by counter tube 17.

Counter tube 17 was scanned by moving in a direction for increasing angular position $2\theta$ of tube 17 at a predetermined speed to measure the diffraction intensity of the X-ray incident to tube 17, where angular position $2\theta$ was read out by scale plate 18.

FIG. 3A shows the case wherein the atmosphere in which a semiconductor substrate was set was evacuated to a pressure of as low as "$1 \times 10^{-7}$ Torr" before depositing the aluminum alloy line layer by means of sputtering. In this case, the crystal face of the deposited alloy exhibited the highest diffraction intensity in the (111) plane. The diffraction intensities of other crystal faces were low in the (200) plane, and "$I_{111}/I_{abc} = 510$" was obtained, where $I_{111}$ indicates the diffraction intensity of the (111) plane and $I_{abc}$ indicates the highest diffraction intensity in other crystal faces (here, diffraction intensity of (200) plane). The void coefficient ratio lv at this time was remarkable; "$lv = 0\%$". Thus, the occurrence of Al voids can be almost completely suppressed by setting almost all the crystal faces of the Al-Si alloy in the (111) plane.

FIG. 3B shows the case wherein the pressure prior to depositing the alloy layer was set to "$5 \times 10^{-7}$ Torr". In this case, the crystal face of the Al-Si alloy was oriented mainly in the (111) plane, "$I_{111}/I_{abc} = 2.1$" was obtained, and the void coefficient ratio was "$lv = 10\%$".

FIG. 3C shows an example of a conventional a Al-Si alloy as a reference. In this case, the pressure prior to depositing the alloy was set to "$1 \times 10^{-6}$ Torr". There were various orientations, the diffraction intensity was highest in the (220) plane, and "$I_{111}/I_{abc} = 0.7$" and "$lv = 43\%$" were obtained.

Figure 5:
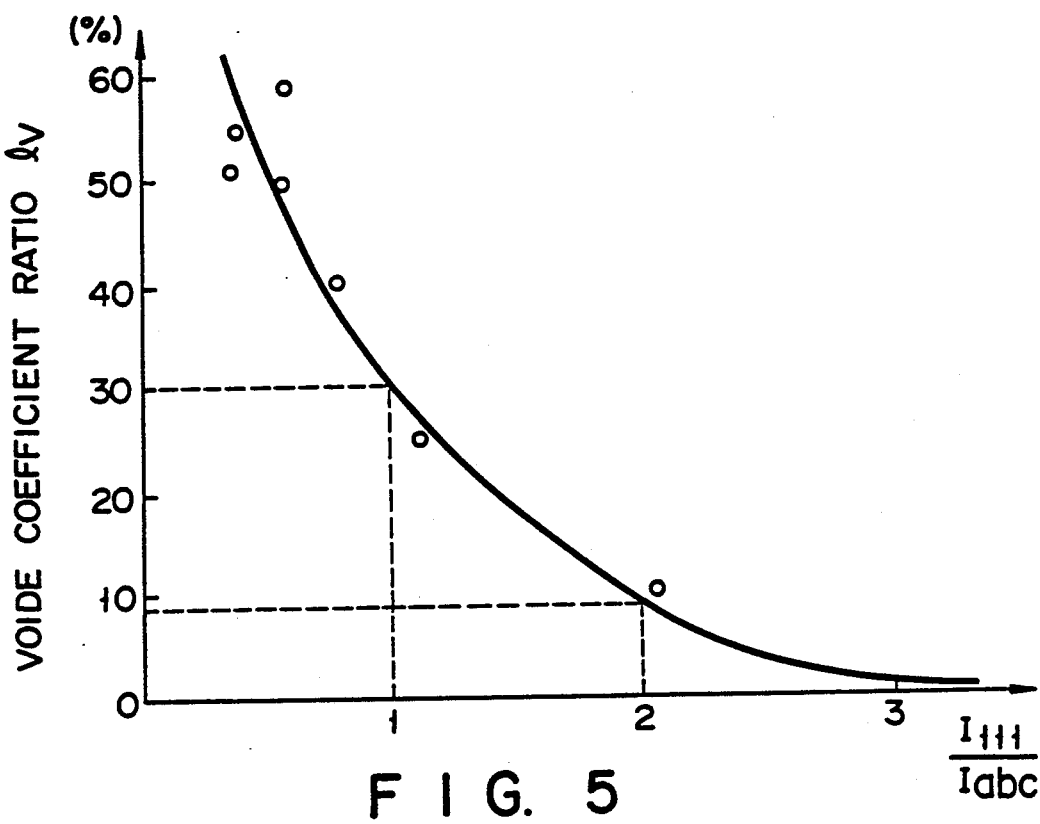
FIG. 5 is a view showing the relationship between $I_{111}/I_{abc}$ and the void coefficient ratio lv.

FIG. 5 shows the relationship between $I_{111}/I_{abc}$ and the void coefficient ratio lv. As is apparent from FIG. 5, in the case of "$I_{111}/I_{abc} \geq 1$", the void coefficient ratio lv becomes as low as 30%, and the occurrence of Al voids is suppressed to a certain degree, and in the case of "$I_{111}/I_{abc} \geq 2$", the void coefficient ratio lv is reduced to approximately 10%, and the occurrence of Al voids is strongly suppressed.

The diffraction intensity and the state of the crystal face described above were values obtained at the time of Al-Si alloy deposition to form the Al-Si alloy line layer. The diffraction intensity and the crystal face condition after the Al-Si alloy line is formed are similar.

Figure 2C:
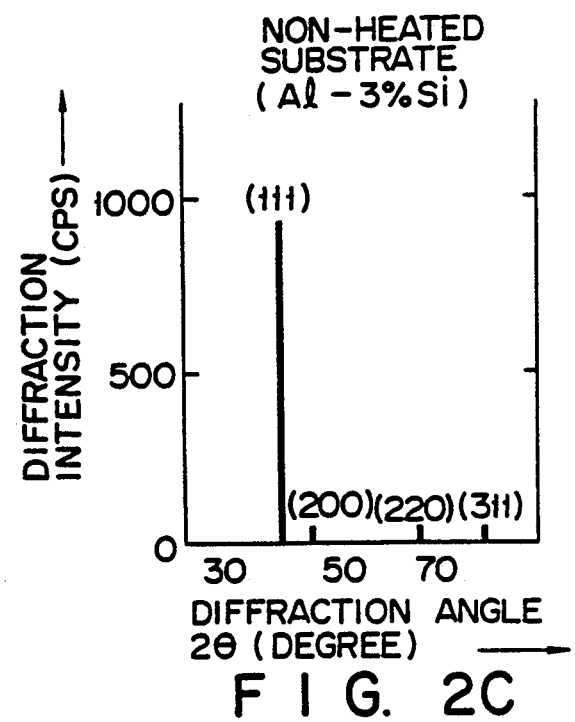

FIG. 2A shows an example wherein the Al-Si alloy was sputtered after the substrate was heated, while FIGS. 2B and 2C show the values of the diffraction intensities when the Al-3%Si alloy was deposited without heating the substrate at sputtering time. FIG. 2B shows the state before heat treatment was performed, after the Al-Si alloy was deposited, and FIG. 2C shows the value of the diffraction intensity after the Al-Si alloy was deposited, and patterning and heat treating steps had been completed. Referring to FIG. 2C, after the heat treatment was performed, the diffraction intensity became slightly lower in the (111) plane, but the crystal face was still oriented mainly in the (111) plane, and the void coefficient ratio lv at this time was substantially the same as that at depositing time.

The grain size of the Al crystal in the aluminum alloy line layer designated in the embodiment described above is set to approx. ¼ of the line width Al-Si. Therefore, the grain boundary in the Al-Si alloy line can be reduced in this state to be effective to suppress the movement of the Al atoms.

Figure 6:
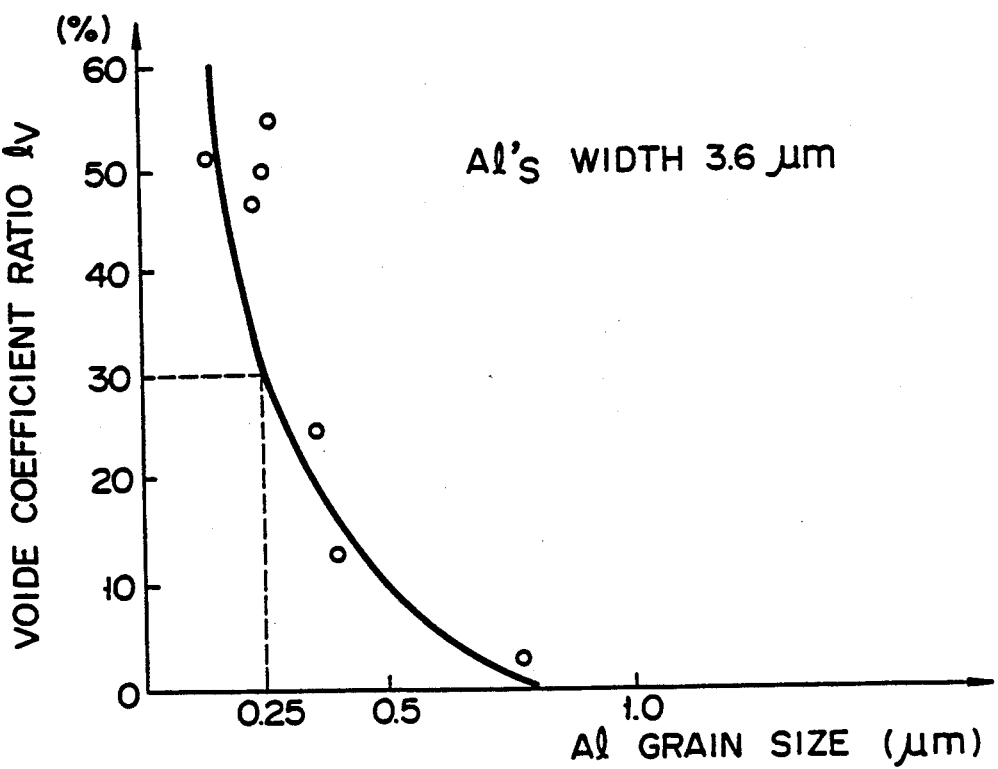
FIG. 6 is a view showing the relationship between the grain size of aluminum and the void coefficient ratio lv.

FIG. 6 shows the relationship between the grain size of the Al crystal and the void coefficient ratio according to inventor's experiments. It will be understood from FIG. 6 that the grain size of the Al crystal significantly affects the void coefficient ratio lv. In other words, as the aluminum grain increases in size, the void coefficient ratio lv in value.

When the base material was a silicon nitride film formed by means of a CVD method, Al-Si alloy line width was 3.6 microns and the grain size of the Al crystal was 0.8 micron, i.e., the grain size of the crystal was reduced to approx. ¼ of the width of the line, for example, in the experiment, the void coefficient ratio lv became as low as 30%. On the other hand, the grain size of the Al crystal here becomes excessively large, the possibility arises that the grain boundary of the crystal will cross the line width, with the result that a slit-like void may be formed. Accordingly, the upper limit of the grain size of the Al crystal is the same degree as the line width, and the grain size of the crystal capable of suppressing the Al voids to a certain degree is as represented by the following formula:

$$(W/14) < l < W$$

where l is the grain size of the crystal, and W is the line width, and the range of the grain size of the Al crystal capable of suppressing most Al voids is as represented by the following formula:

$$(W/4) < l < (W/1.5)$$

In the embodiment described above, the layers under the first and second aluminum alloy line layer 103 and 105 are respectively formed of first and second PSG films 102 and 104.

Here, the experiments of the under layer material of the aluminum alloy line layer will be described. The diffraction intensities in the different orientations when P-SiN and $Si_3N_4$ are used as base materials are as shown in FIGS. 7A and 7B. The values of "$I_{111}/I_{abc}$" in these cases were 0.6 and 0.58, representing a problem in suppressing the void coefficient ratio lv.

Figure 8A:
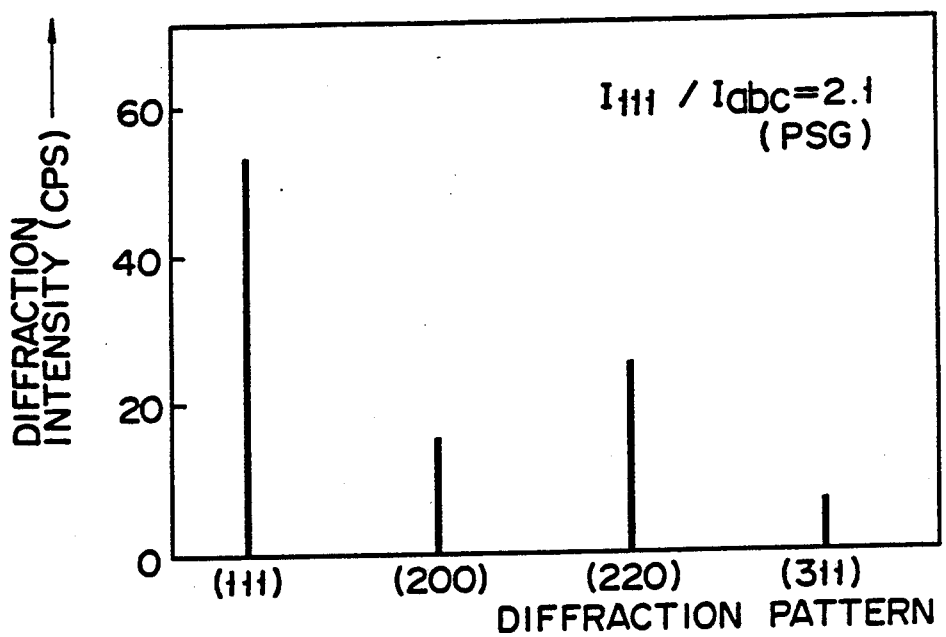
Figure 8B:
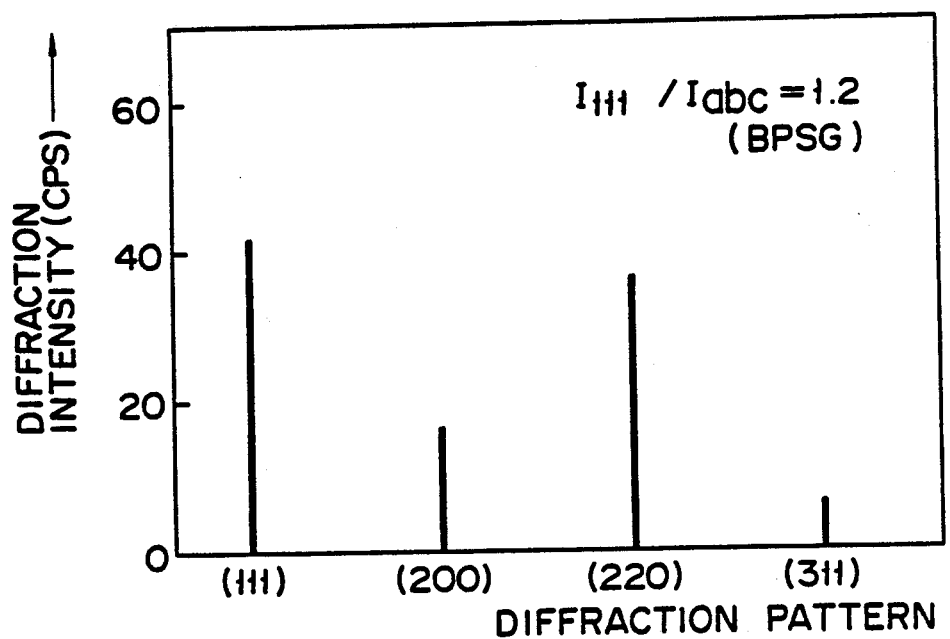

The relationships between the orientation and the diffraction intensity in the case where the layer provided under line layers 103 and 105 is formed of PSG film, as in the embodiment described above, and in the case where the base material is formed of BPSG film of the similar oxide film, are shown in FIGS. 8A and 8B. More specifically, the crystal face of the Al-Si alloy can be oriented mainly in the (111) plane. Since the oxide film has a smaller bonding energy than the nitride film, the oxide film can be readily bonded to the Al atoms. Thus, the consumption of the energy of the Al atoms decreases, so that the grain size of the crystal can increase. Further, since the oxide film has lower internal stress than the nitride film, the stress applied, to the Al-Si alloy film decreases, thereby suppressing the generation of Al voids.

In the examples shown in FIGS. 8A and 8B, the values of $I_{111}/I_{abc}$ are 2.1 and 1.2 which are relatively large.

The factors for orienting the crystal faces of the crystal grains of the Al-Si alloy line layer in (111) plane are the substrate temperature at the alloy sputtering time, as described with respect to FIG. 2, and the pressure prior to depositing the alloy, as described with respect to FIG. 3. When the pressure prior to depositing the alloy is increased, gas (mainly $H_2O$) absorbed into the semiconductor substrate is completely removed, thus controlling the substrate temperature, and the Al-Si alloy is then sputtered and deposited. It is considered that the removal of the $H_2O$ affects the control of the orientation. The layer provided under line layer 103 and 105 is another factor of affecting the orientation of the crystal face.

It is thus considered that the base material affects the orientation of the crystal face with respect to the internal stress of the layer provided under line layer 103 and 105, the uneven state of the surface, the moisture absorbed in the surface, and also the orientation of the layer, these factors also affecting the grain size of the Al-Si alloy crystal.

Examples of the oxide film used as the layer provided under line layer are the PSG film and the BPSG film formed by means of the CVD method. In addition, there are an SiO film formed by means of the a CVD method, and an oxide film formed by means of the plasma CVD method.

FIG. 9 shows a semiconductor device according to a second embodiment of the present invention. The same reference numerals as in the first embodiment in FIG. 1 denote the same parts in the second embodiment. In this second embodiment, aluminum alloy line layer 103 made of a first Al-Si alloy is formed to orient the crystal face mainly in the (111) plane, and the grain size of the crystal is set within a range of ¼ to 1/1.5 of the line width.

This second embodiment is effective when employed in a semiconductor device having large aspect ratio. P-SiN film 1041 is formed, laminarly, by means of a plasma CVD method, on first PSG film 102 on which first alloy line layer 103 is formed. The P-SiN film 1041 is then flattened on the surface coated with a photoresist to form a flat surface by an etch-back step of dry etching the entire surface. PSG film 1042 is formed by means of, for example, a CVD method, on flattened P-SiN film 1041, contact openings are formed in PSG film 1042 and in P-SiN film 1041, and second alloy line layer 105, made of Al-Si alloy, is formed similarly to that of the first embodiment.

In the second embodiment as described above, the crystal face of the Al-Si alloy is oriented mainly in the (111) plane, and the advantages as described with respect to the first embodiment can similarly be obtained therein by controlling the grain size of the crystal.

In the case of the ordinary etch-back step, the material under the resist is formed of a nitride film, so as to equalize the etching velocity to the resist. With the nitride film serving as the base material, the second alloy line layer is then formed.

However, in the case of the second embodiment, PSG film 1042 is additionally formed on P-SiN film 1041 as a nitride film, and with PSG film 1042 of an oxide film serving as a base, second alloy line layer 105 is then formed. Accordingly, the crystal face of second alloy line layer 105 is oriented mainly in the (111) plane.

FIG. 10 shows a third embodiment of the invention. In the third embodiment, first PSG film 102 and first alloy line layer 103 of Al-Si alloy are formed on silicon substrate 100 similarly as in the first embodiment. Thin silicon nitride ($Si_3N_4$ or P-SiN) layer 1043 is formed on first PSG film 102, on which first alloy line layer 103 having the uneven surface is formed.

A large uneven portion exists on the surface of silicon nitride film 1043 in this state, ethanol and spin on glass (SOG) 1044 containing mainly $SiO_2$ are coated in the recess portion, and cured by heating. PSG film 1045 is formed on cured SOG 1044, a contact opening is formed, and second alloy line layer 105 made of Al-Si alloy is then formed.

The content of the aluminum alloy line material employed in the embodiments described above may be mainly aluminum, and an aluminum line deposited by an E-gun method Al-Cu alloy line, Al-Si-Cu alloy line, Al-Si-Ti alloy line may be used instead of the one described. The aluminum alloy line layer employs a double-metal layer structure in the embodiments described above. However, it may also employ a 1-layer or a 3-layer structure.

What is claimed is:

1. An aluminum alloy connecting means of a type which has resistance to stress migration formed in a semiconductor integrated circuit, comprising:
   an insulating layer formed on a semiconductor substrate wherein circuit devices are constructed;
   an alloy line layer which includes crystal grains, each of which has crystal faces, and comprising aluminum as a constituent of the alloy and formed on said insulating layer such that the crystal faces of the crystal grains of said alloy line layer are mainly oriented in the (111) plane, and the grain size of the crystal being regulated so as to satisfy the following relationship:

$$(W/14) < l < W$$

where l is the grain size of the alloy crystal, and W is the line width; and
   a protection film of a type which has internal stresses therein, protecting at least said alloy line layer and formed on or above at least part of said alloy line layer so that said internal stresses of the protection film acts thereon, wherein an occurrence of stress migration due to the tensile stress of said protection film is prevented.

2. The aluminum alloy line according to claim 1, wherein said protection film is of a type which has internal stresses sufficient to cause stress migration in said alloy layer.

3. The aluminum alloy line according to claim 2, wherein the grain size of the alloy crystal is regulated so that the relationship between the grain size l of the alloy crystal and the width W of the line satisfies the following formula:

$$(W/4) \leq l \leq (W/1.5).$$

4. The aluminum alloy line according to claim 3, wherein said alloy line layer comprises aluminum and silicon.

5. The aluminum alloy line according to claim 4, wherein the crystal faces of the crystal grains of said alloy line layer are disposed in the (111) plane in such a way that the x-ray diffraction intensity at the (111) plane is greater than at other planes and satisfies the following relationship:

$$I_{111}/I_{abc} > 2$$

wherein $I_{111}$ is the x-ray diffraction intensity in the (111) plane, and $I_{abc}$ is the highest diffraction intensity at the other planes.

6. The aluminum alloy line according to claim 5, wherein said protection film is a surface protection film.

7. The aluminum alloy line according to claim 5, wherein said protection film is formed of a silicon nitride film.

8. The aluminum alloy line according to claim 7, wherein said protection film is a surface protection film.

9. An aluminum alloy connecting means according to claim 8, wherein said insulating layer is formed of an oxide and said alloy line layer is formed on said insulating layer.

10. The aluminum alloy line according to claim 1, wherein said alloy line layer comprises aluminum and silicon.

11. The aluminum alloy line according to claim 10, wherein the crystal faces of the crystal grains of said alloy line layer are disposed in the (111) plane in such a way that the x-ray diffraction intensity at the (111) plane is greater than at other planes and satisfies the following relationships:

$$I_{111}/I_{abc} > 2$$

wherein $I_{111}$ is the x-ray diffraction intensity in the (111) plane, and $I_{abc}$ is the highest diffraction intensity at the other planes.

12. The aluminum alloy line according to claim 11, wherein said protection film is formed of a silicon nitride film.

13. The aluminum alloy line according to claim 12, wherein said protection film is a surface protection film.

14. The aluminum alloy line according to claim 11, wherein said protection film is a surface protection film.

15. The aluminum alloy line according to claim 1, wherein said protection film is formed of a silicon nitride film.

16. The aluminum alloy line according to claim 15, wherein said protection film is a surface protection film.

17. The aluminum alloy line according to claim 1, wherein said protection film is a surface protection film.

18. An aluminum alloy line structure formed in a semiconductor circuit comprising:
- a first oxide film layer formed on a semiconductor substrate wherein circuit devices are constructed and having a first contact opening in order to expose a portion of the substrate surface;
- a first aluminum alloy line layer comprising aluminum as a constituent of the alloy and formed as an electrical connecting means on said first oxide film to contact the substrate surface through said first contact opening; wherein the crystal faces of the crystal grains of said first alloy line layer are mainly oriented in the (111) plane;
- a nitride film layer formed on said first oxide film and said first alloy line layer having a surface flattened by a dry etching process and having a second contact opening to expose a surface portion of said first alloy line layer;
- a second oxide film layer formed on said nitride film layer except for said second contact opening to expose the surface portion of said first alloy line layer;
- a second aluminum alloy line layer comprising aluminum as the major constituent of the alloy and formed as an electrical connecting means on said second oxide film layer to contact said first aluminum alloy line layer via said second contact opening; and
- a protection film of a type which has internal stresses therein, protecting at least said alloy line layer and formed on or above at least part of said alloy line layer so that said internal stresses of the protection film acts thereon,
- wherein the crystal faces of the crystal grains of said second alloy line layer are mainly oriented in the (111) plane to prevent occurrence of stress migration due to the tensile stress of said protection film, and
- the grain size of the crystal being regulated so as to satisfy the following relationship:

$$(W/14) < l < W$$

where l is the grain size of the alloy crystal, and W is the line width.

19. An aluminum alloy line structure formed in a semiconductor circuit comprising:
- a first oxide film layer formed on a semiconductor substrate wherein circuit devices are constructed and having a first contact opening in order to expose a portion of the substrate surface;
- a first aluminum alloy line layer comprising aluminum as a constituent of the alloy and formed as an electrical connecting means on said first oxide film to contact the substrate surface through said first contact opening; wherein the crystal faces of the crystal grains of said first alloy line layer are mainly oriented in the (111) plane;
- a nitride film layer formed laminarly on said first oxide film and said first alloy line layer and having a second contact opening to expose a surface portion of said first alloy line layer;
- a spin-on-glass layer formed in the recesses existing in said nitride film layer, and cured;
- a second oxide film layer formed on said nitride film layer and said spin-on-glass layer except for said second contact opening to expose the surface portion of said first alloy line layer;
- a second aluminum alloy line layer comprising aluminum as a constituent of the alloy and formed as an electrical connecting means on said second oxide film layer to contact said first aluminum alloy line layer via said second contact opening; and
- a protection film of a type which has internal stresses therein, protecting at least said alloy line layer and formed on or above at least part of said alloy line layer so that said internal stresses of the protection film acts thereon,
- wherein the crystal faces of the crystal grains of said second alloy line layer are mainly oriented in the (111) plane to prevent occurrence of stress migration due to the tensile stress of said protection film, and
- the grain size of the crystal being regulated so as to satisfy the following relationship:

$$(W/14) < l < W$$

where l is the grain size of the alloy crystal, and W is the line width.

20. A method for manufacturing an aluminum alloy line, which has improved resistance to stress migration comprising the steps of:
- a first step of forming an insulating layer is formed on a semiconductor substrate;
- a second step of forming an alloy line layer comprising aluminum on said insulating layer, said alloy line layer being formed by sputtering such that the crystal faces of the crystal grains of said alloy line layer are oriented mainly in the (111) plane and the grain size of the crystal is regulated so as to satisfy the following relationship;

$$(W/14) < l < W$$

where l is the grain size of the alloy crystal, and W is the line width; and
- a third step of forming a protection film having internal tensile stresses protecting at least said alloy line layer, the protection film having formed directly on or above said alloy line layer, so that the tensile stress of said protection film acts on said alloy line layer.

21. A method as in claim 20, wherein said surface protection layer is of a type with internal stresses of the type which would lead to stress migration in said alloy line layer.

22. A semiconductor device of a type with resistance to stress migration, comprising:
- a substrate;
- a first insulating layer, formed on said substrate, and having a contact portion therein which does not cover said substrate over a terminal area;
- alloy line layer means, including aluminum as one constituent thereof, covering said first insulating layer and covering and in contact with said substrate at said terminal area, at least a surface portion of said alloy line layer means having crystal grains which have crystal faces which are mainly oriented in the (111) plane, wherein a grain size of said crystal grains are regulated so as to satisfy the following relationship:

$$(W/14) \leq l \leq W$$

where l is the grain size of the alloy crystal, and W is the line width; and surface protection layer means, covering at least said surface portion of said alloy line layer means, for protecting same, said surface protection layer means of a type which has internal stresses therein, which could cause stress migration in said alloy line layer means.

23. A device as in claim 22, wherein said alloy line layer means includes:

a first alloy line layer, in contact with said terminal area and covering said first insulating layer, a second insulating layer, covering said first alloy line layer, and formed with a contact hole therein, and a second alloy line layer, covering at least part of said second insulating layer and in contact with said first alloy line layer through said contact hole, and including said surface portion, said surface protection layer means covering said second insulating layer and said second alloy line layer.

24. A method of producing a semiconductor device, that has a substrate; alloy line layer means, including aluminum as one constituent thereof, in contact with said substrate, and a surface protection layer of a type with internal stresses of the type which would lead to stress migration in said alloy line layer means, but which has a structure with resistance to stress migration, comprising the steps of:

forming said alloy line layer means having crystal grains which have crystal faces which are mainly oriented in the (111) plane, to prevent movement of Al atoms to grain boundaries; and covering said alloy line layer means with said surface protection layer.

25. A method as in claim 24, wherein a grain size of said crystal grains are regulated so as to satisfy the following relationship:

$$(W/14) \leq l \leq W$$

where l is the grain size of the alloy crystal, and W is the line width; and surface protection layer means.

* * * * *